(12) United States Patent
Tachikawa et al.

(10) Patent No.: US 7,972,653 B2
(45) Date of Patent: Jul. 5, 2011

(54) METHOD FOR REMOVING AMORPHOUS CARBON COATINGS WITH OXIDIZING MOLTEN SALTS AND COATED MEMBER REGENERATION METHOD

(75) Inventors: Hideo Tachikawa, Nisshin (JP); Ken-ichi Suzuki, Nagoya (JP); Fumio Shimizu, Toyota (JP); Takashi Iseki, Aichi-gun (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 889 days.

(21) Appl. No.: 11/854,957

(22) Filed: Sep. 13, 2007

(65) Prior Publication Data

US 2008/0075846 A1 Mar. 27, 2008

(30) Foreign Application Priority Data

Sep. 20, 2006 (JP) ................................. 2006-254289

(51) Int. Cl.
*B05D 3/02* (2006.01)
(52) U.S. Cl. .............................. 427/140; 216/96; 216/83
(58) Field of Classification Search ..................... 216/96
See application file for complete search history.

(56) References Cited

U.S. PATENT DOCUMENTS

| 6,391,215 | B1 * | 5/2002 | Smith et al. ...................... 216/28 |
| 2004/0000861 | A1 * | 1/2004 | Dorfman ........................ 313/495 |
| 2005/0012791 | A1 * | 1/2005 | Anderson et al. ............... 347/85 |

FOREIGN PATENT DOCUMENTS

| JP | 4-193406 | 7/1992 |
| JP | 5-112885 | 5/1993 |
| JP | 5-339758 | 12/1993 |
| JP | 8-325755 | 12/1996 |
| JP | 11-166625 | 6/1999 |
| JP | 2002-203342 | 7/2002 |
| JP | 2002-332582 | 11/2002 |
| JP | 2003-200350 | 7/2003 |

OTHER PUBLICATIONS

Sniecikowski et al. Dry Etching of Balk 4H-SiC and DLC/SiC Structures, Journal of Wide Bandgap Materials, Apr. 2002, vol. 9 No. 4 pp. 157-158.*

* cited by examiner

*Primary Examiner* — Timothy H Meeks
*Assistant Examiner* — Collette Ripple
(74) *Attorney, Agent, or Firm* — Oblon, Spivak, McClelland, Maier & Neustadt, L.L.P.

(57) ABSTRACT

A coating film removal method for a coated member having a coating film formed over the surface of a substrate is disclosed, which can easily achieve a coating film removal, even for a carbon-based coating film containing carbon as a main component, besides a carbon-based coating film containing a metal element etc. A coated member regeneration method is also disclosed, which removes a coating film from a coated member, and then forms a new coating film over the member, to regenerate the coated member. The coating film removal method is adapted to remove a carbon-based coating film from a coated member (10) including a substrate, and the carbon-based coating film coated on at least a portion of a surface of the substrate while containing carbon as a main component. The coating film removal method includes bringing a molten salt having an oxidizing function for carbon into contact with the carbon-based coating film, to remove at least a portion of the carbon-based coating film coated over the surface of the substrate. A coated member regeneration method includes removing the carbon-based coating film from the coated member, using such coating film removal method, and subsequently forming a coating film on at least a portion of a surface of the film-removed member (11).

13 Claims, 2 Drawing Sheets

METHOD FOR REMOVING AMORPHOUS CARBON COATINGS WITH OXIDIZING MOLTEN SALTS AND COATED MEMBER REGENERATION METHOD

INCORPORATION BY REFERENCE

The disclosure of Japanese Patent Application No. 2006-254289 filed on Sep. 20, 2006, including the specification, drawings, and abstract is incorporated by reference in its entirety.

BACKGROUND OF THE INVENTION

1. Field of the Invention

The present invention relates to a coating film removal method for removing at least a portion of a coating film from a coated member, in which the coating film is formed over a substrate of the coated member, and more particularly to a method for removing a carbon-based coating film containing carbon as a main component. The present invention also relates to a method for regenerating a coated member, which removes a coating film from the coated member, and then forms a new coating film over the member.

2. Description of the Related Art

Generally, a coating film meeting a desired performance is formed over the surfaces of tools, molds, or elements of various devices. For example, a hard film is formed over the surface of a tool or mold requiring durability. As such a tool or mold is used, the hard film is damaged. In this case, the hard film is completely removed from the surface of the tool or mold, and a new hard film is formed over the tool or mold surface, to enable re-use of the tool or mold. Also, it may be desired to remove the hard film from a disadvantage region where the hard film exists. If the hard film has a thickness larger than a desired thickness, it may also be necessary to remove the surface portion of the hard film, in order to adjust the dimension of the hard film.

An example of a method for removing a hard film is a chemical treatment. For example, Japanese Laid-open Patent Publication No. H5-112885 discloses a removing agent which comprises a mixed aqueous solution comprising an alkali hydroxide as a main component, to be usable for removal of a titanium coating film or a coating film of a titanium compound such as TiN, TiC, or TiCN. Japanese Laid-open Patent Publication No. H8-325755 discloses a method for stripping a hard film of TiAlN, using an aqueous solution of pH 10 or more containing permanganate ions and/or bichromate ions.

However, it is difficult to remove a carbon-based coating film such as an amorphous carbon (diamond-like carbon (DLC)) film, using the above-mentioned chemical treatment. This is because such a carbon-based coating film is chemically stable. In the case of Japanese Laid-open Patent Publication No. 2003-200350, abrasive particles are injected, together with air, onto a DLC film of a tool, in which the DLC film is formed on the surface of a substrate of the tool, in order to remove the DLC film from the tool. The case of Japanese Laid-open Patent Publication No. 2003-200350 has a fear that, due to the use of the abrasive, the surface roughness of the substrate may increase after the removal of the DLC film, or even the substrate may be abraded, thereby causing a deformation in the dimension of the tool.

Also, Japanese Laid-open Patent Publication No. H5-339758 discloses a method for etching a DLC film in a glow discharge or arc discharge atmosphere. Carbon, which is a main component of the DLC film, can be easily removed as it is burned during a reaction with activated oxygen. However, where the DLC film contains silicon or metal elements, it is difficult to remove the DLC film. Furthermore, the method requires high costs because it is necessary to use an apparatus for generating glow discharge or arc discharge.

SUMMARY OF THE INVENTION

Therefore, the present invention has been made in view of the above-mentioned problems, and it is an aspect of the present invention to provide a new coating film removal method capable of easily removing a carbon-based coating film containing carbon as a main component, from a coated member, in which the coating film is formed over a substrate of the coated member, and easily removing the carbon-based coating film even when the coating film contains a metal element or the like. Another aspect of the present invention is to provide a method for regenerating a coated member by removing a coating film from the coated member, and then forming a new coating film over the member.

In one aspect, the present invention provides a coating film removal method for removing a carbon-based coating film from a coated member including a substrate, and the carbon-based coating film coated on at least a portion of a surface of the substrate, the coating film containing carbon as a main component, comprising: bringing a molten salt having an oxidizing function for carbon into contact with the carbon-based coating film, to remove at least a portion of the carbon-based coating film coated over the surface of the substrate.

In the coating film removal method of the present invention, the molten salt can preferably comprise at least one oxidizing agent selected from the group consisting of nitrates, sulfates, and metal oxides. In this case, the molten salt can preferably comprise a mixture salt comprising at least one selected from the group consisting of nitrites, carbonates, fluorides, and chlorides, together with the oxidizing agent.

The molten salt can preferably have a temperature of 100° C. or more, and can further preferably have a temperature of not less than 120° C., but not more than 700° C.

The molten salt can preferably exhibit a removal rate of 0.01 μm/h or more for amorphous carbon consisting of 75 at % of carbon and 25 at % of hydrogen, when the molten salt has a temperature of 450° C.

In another aspect, the present invention provides a coated member regeneration method for regenerating a coated member having a carbon-based coating film, comprising: removing the carbon-based coating film from the coated member, using the coating film removal method of the present invention; and subsequently forming a coating film on at least a portion of a surface of the film-removed member.

EFFECTS OF THE INVENTION

In accordance with the coating film removal method of the present invention, a molten salt is brought into contact with a carbon-based coating film (hereinafter, simply referred to as a "coating film", if necessary), to remove the carbon-based coating film. The molten salt used in the present invention has an oxidizing function for carbon. Accordingly, carbon constituting the carbon-based coating film, namely, carbon, is oxidized and so burned, so that it is emitted in the form of gas. As a result, the removal of the carbon-based coating film is proceeded.

Where a metal element or a semiconductor element such as silicon is contained in the carbon-base coating film, a film consisting of a metal oxide or silicon oxide (oxide film) is formed on the surface of the carbon-based coating film in the molten salt. The oxide film is dissolved in the molten salt in accordance with a reaction thereof with the molten salt, so that it does not hinder the progress of the film removal. Thus, even a carbon-based coating film containing a metal element or semiconductor element can be effectively removed.

In accordance with the coating film removal method of the present invention, which is a chemical polishing using a molten salt, it is possible to uniformly remove the coating film without causing a high surface roughness of the film surface. Accordingly, it is possible to remove the surface portion of the coating film, using the coating film removing method of the present invention, in order to adjust the thickness of the coating film.

It is also possible to suppress the corrosion of the substrate caused by the molten salt by appropriately selecting a combination of the kind of the molten salt and the material of the substrate. That is, the substrate, which is obtained after the removal of the coating film from the coated member using the film removal method of the present invention, has the same state as the substrate of the coated member before the film removal. Accordingly, the coating film removal method of the present invention is suitable for a method for removing a coating film from a coated member in the coated member regeneration method of the present invention.

In order to implement the coating film removal method of the present invention, it is desirable to use a vessel capable of maintaining the molten salt at least in a liquid phase for a certain time. Accordingly, it is possible to inexpensively perform a film removal without using an expensive apparatus. Since the coating film to be removed has a thickness of several microns, the amount of the removed coating film once is small. Therefore, it is possible to perform the film removal for a plurality of coated members, using the same molten salt up to a certain number of repetition times.

It is possible to adjust the usable temperature range of the molten salt, using a mixture salt as the molten salt. Accordingly, it is possible to achieve a film removal in a relatively low temperature range while maintaining a certain film removal rate. Consequently, it is possible to suppress the substrate of the coated member from being degraded or deformed when the substrate has a low heat resistance. That is, the substrate, which is obtained after the removal of the coating film from the coated member using the film removal method of the present invention, has the same shape or properties as the substrate of the coated member before the film removal. Accordingly, the coating film removal method of the present invention is suitable for a method for removing a coating film from a coated member in the coated member regeneration method of the present invention. Note that, the "film removal rate" is defined by a thickness of the carbon-based coating film removed per hour.

In order to burn the carbon-based coating film in a gas phase, this process should be carried out at a considerably-high temperature (600° C. or more). Only under this condition, carbon can be oxidized. In accordance with the coating film removal method of the present invention using a molten salt, however, carbon can be burned even at a low temperature, so that a film removal is proceeded. Also, when a carbon-based coating film containing a metal element etc. is burned in a gas phase, an oxide film of the metal element is formed on the carbon-based coating film due to a reaction of the metal element with oxygen present in the atmosphere. This oxide film is not removed in the gas-phase reaction, so that no film removal is achieved. In accordance with the coating film removal method of the present invention using a molten salt, however, it is possible to effectively remove the carbon-based coating film because, although an oxide film is formed, it is dissolved in the molten salt.

BRIEF DESCRIPTION OF THE DRAWINGS

The above and other objects and features of the present invention will become apparent from the following description of preferred embodiment, given in conjunction with the accompanying drawings, in which.

DETAILED DESCRIPTION OF THE PREFERRED EMBODIMENTS

Figure 1:
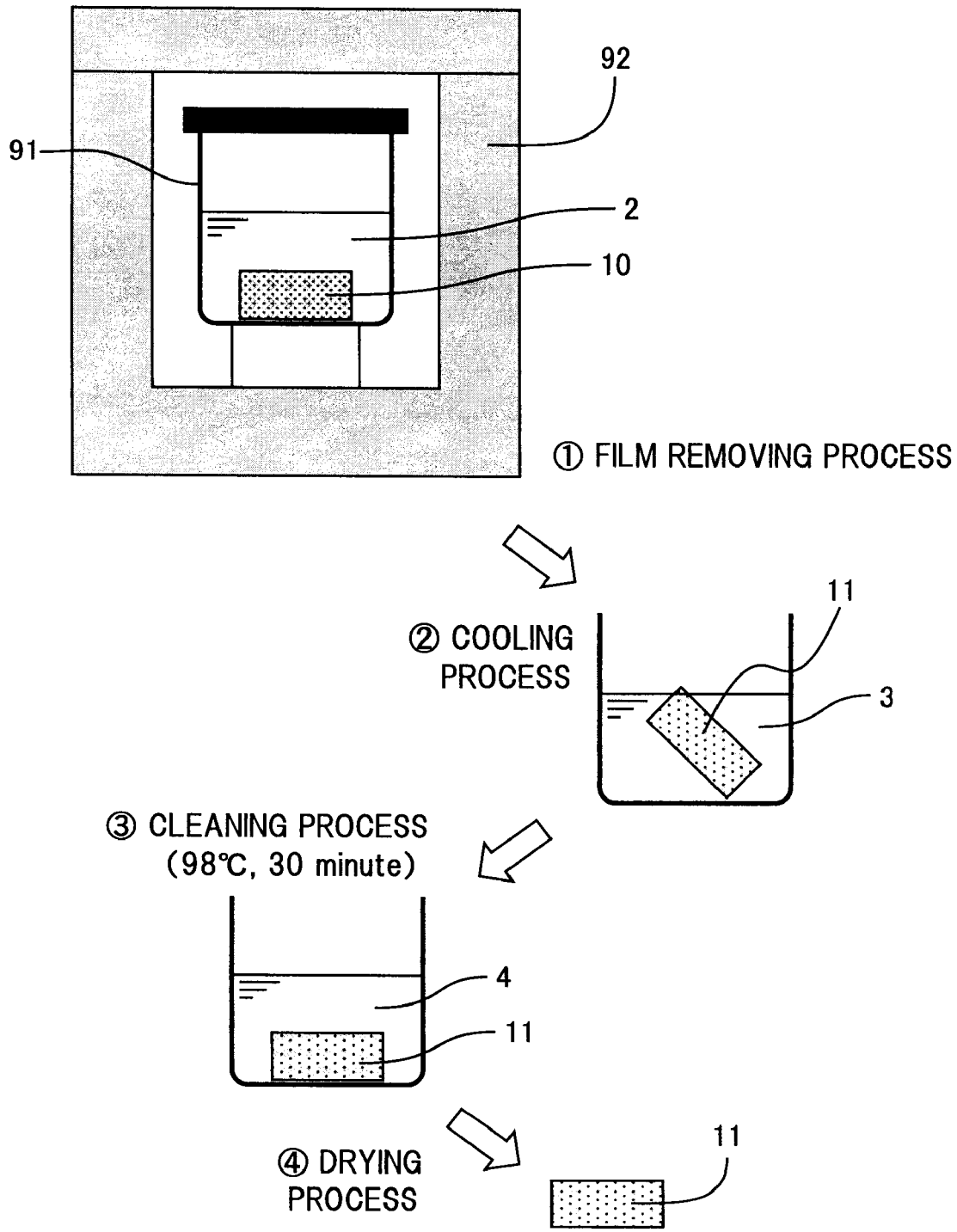
FIG. 1 is a schematic view explaining the procedure of a coating film removal method of the present invention.

Various embodiments of the present invention will now be described in detail with reference to the accompanying drawings.

Hereinafter, preferred embodiments for implementing a method for removing a coating film in accordance with the present invention and a method for regenerating a coated member in accordance with the present invention will be described.

The coating film removal method of the present invention (hereinafter, referred to as a "film removal method of the present invention") is a method for removing a carbon-based coating film from a coated member, which comprises a substrate, and the carbon-based coating film coated on at least a portion of the surface of the substrate.

There is no particular limitation on the carbon-based coating film to be removed in the film removal method of the present invention, as long as the carbon-based coating film contains carbon as a main component. When it is particularly desired to limit the content of carbon, the carbon-based coating film contains carbon in an amount of 30 at % or more, or 40 to 100 at %, based on 100 at % of the entire carbon-based coating film.

In addition to carbon, the carbon-based coating film may contain at least one selected from the group consisting of hydrogen, nitrogen, fluorine, oxygen, a metal element, and a semiconductor element. Preferably, each of the metal element and semiconductor element can be oxidized in a molten salt, to produce an oxide capable of being dissolved in a molten salt, as will be described hereinafter. For example, it is preferred that the metal element be an element of groups III to VI in the periodic table, in particular, titanium, chromium, or tungsten. Examples of the semiconductor element may be silicon, germanium, etc. The total content of the at least one element selected from the group consisting of the metal element and semiconductor element is 40 at % or less, or 35 at % or less.

Although the carbon-based coating film is not limited to a specific structure, it preferably has an amorphous carbon film (DLC film) having an amorphous structure. It is also preferred that the carbon-based coating film is a DLC film containing at least one selected from the group consisting of hydrogen, nitrogen, fluorine, and oxygen. The DLC film may also contain at least one selected from the group consisting of a metal element and a semiconductor element. It may also be possible to remove even a diamond film having a diamond structure, using the film removal method of the present invention.

The carbon-based coating film is formed over the surface of the substrate, using a well-known CVD or PVD method such as a plasma CVD method, an ion plating method, or a sputtering method. For example, where a DLC film is formed using a plasma CVD method, a substrate is put into a vacuum chamber, and a reactive gas and a carrier gas are then introduced into the vacuum chamber, in which plasma is then generated by electrical discharge. Thus, the reactive gas, which comprises C, H, Si, etc. ionized by the plasma, is deposited to the substrate, thereby forming a DLC film. For the reactive gas, a hydrocarbon gas such as methane or acetylene, a silicon compound gas such as $(CH_3)_4Si$(tetramethylsilane: TMS), $SiH_4$, $SiCl_4$, or $SiH_2F_4$, or a hydrogen gas may be used. For the carrier gas, an argon gas or the like may be used.

There is no particular limitation on the material for the substrate of the coated member. For the substrate, any of a metal substrate, a ceramic substrate, or a substrate made of a semiconductor material may be used. Examples of the metal substrate include a substrate made of iron or an iron alloy, a substrate made of nickel or a nickel alloy, a substrate made of cobalt or a cobalt alloy, a substrate made of titanium or a titanium alloy, a substrate made of aluminum or an aluminum alloy, a substrate made of a super hard material, and the like. Examples of the ceramic substrate include substrates of a cermet, alumina, a silicon nitride, and the like. Note that, the certain cermet may contain a carbide. So, when a substrate made of such a cermet is used, it is necessary to carefully select a molten salt, if the substrate may comes into direct contact with the molten salt in the implementation of the film removal method of the present invention. An example of the substrate made of a semiconductor material includes a substrate made of silicon.

Various surface treatments may be performed for the surface of the substrate. For example, a passivation film made of a nitride, a carbide, an oxide, a boride, or a complex compound of at least two thereof may be formed over the surface of the substrate. Of course, a carbon-based coating film may be directly formed over the surface of the substrate.

Concrete examples of a coated member including a carbon-based coating film formed over the surface of the coated member include a tool such as a mold, a drill, an end mill, or a punch, a sliding element such as a clutch or a bearing, a corrosion-resistant member used in a corrosive environment, and an electronic element using a carbon-based coating film as an insulating film or a conductive film.

In the film removal method of the present invention, a molten salt is brought into contact with the carbon-based coating film formed over the surface of the substrate, in order to remove at least a portion of the carbon-based coating film. The simplest method for bringing the carbon-based coating film into contact with the molten salt is to immerse the coated member in the molten salt. For example, a solid salt or oxide is charged into a melting bath at room temperature. The temperature of the melting bath is increased to heat and melt the salt or oxide, and thus to produce a liquid-phase molten salt. Thereafter, the coated member is put into the molten salt contained in the melting bath. In this case, it is preferred that the temperature of the molten salt keeps constant. The coated member is taken out of the molten salt after being immersed in the molten salt for a certain time, and is then cooled. Thus, the procedure for the film removal is stopped. Although the molten salt is in a state of solids adhering to the surface of the cooled coated member, it can be easily removed because most of these solids are soluble in water.

The molten salt exhibits high conductivity due to ions thereof. Accordingly, the film removal is accelerated by performing, for example, a DC electrolysis under the condition in which a cathode of iron etc. and the coated member (anode) are inserted into the molten salt.

The molten salt used has an oxidizing function for carbon. When the carbon-based coating film comes into contact with the molten salt, the main component of the carbon-based coating film, namely, carbon, is oxidized and so burned, so that it is emitted in the form of gas. In addition to carbon, the molten salt, which has an oxidizing function for carbon, also oxidizes hydrogen, nitrogen, metal elements, and semiconductor elements. Thus, the removal of the carbon-based coating film is proceeded as the carbon-based coating film is consumed in accordance with the oxidation thereof.

Of course, when the carbon-based coating film containing a metal element and/or a semiconductor element is oxidized in accordance with the function of the molten salt, as described above, a film made of a metal oxide or a silicon oxide (oxide film) is formed on the surface of the carbon-based coating film. Such an oxide reacts with the molten salt, so that it is dissolved in the molten salt. Since the oxide film disappears from the surface of the carbon-based coating film in the above-described manner, it does not hinder the progress of the film removal.

There is no limitation on the molten salt, as long as the molten salt can exhibit an oxidizing function for carbon. For example, molten salts, which contain oxygen in a molten state, exhibit a strong oxidizing function. Such molten salts include a molten salt, which generates oxygen as it changes from a higher-order oxide to a lower-order oxide in accordance with a charge conversion thereof in a molten state (for example, $KNO_3 \rightarrow KNO_2$), a molten salt of a metal oxide, which exhibits a strong oxidization property as it supplies oxygen when being melted, and a molten salt containing dissolved oxygen causing an oxidizing function. Accordingly, it is preferred that the molten salt comprise at least one oxidizing agent selected from the group consisting of nitrates, sulfates, and metal oxides. Here, the "oxidizing agent" means a material functioning as an oxidizing agent at least for carbon. Concrete examples of the oxidizing agent as nitrates include lithium nitrate, sodium nitrate, potassium nitrate, magnesium nitrate, calcium nitrate, and barium nitrate. Concrete examples of the oxidizing agent as sulfates include lithium sulfate, sodium sulfate, potassium sulfate, magnesium sulfate, calcium sulfate, and barium sulfate. Concrete example of the oxidizing agent as metal oxides include oxides exhibiting a high oxidizing property, namely, a molybdenum oxide ($MoO_3$), a tungsten oxide ($WO_3$), a manganese oxide ($MnO_2$), a silver oxide (AgO), and a chromium oxide ($CrO_3$). One of the above-described materials may be used alone as the molten salt. Also, one or more salt may be used in combination with one or more metal oxide. Alternatively, two or more materials selected from the same kind of salts or the same kind of metal oxides are used in the form of a mixture. In addition, carbonates which will be described later may be used as an oxidizing agent, even though the carbonates exhibit a weak oxidizing function for carbon, as compared to nitrates, etc.

The molten salt may also be a mixture salt comprising at least one selected from the group consisting of nitrites, carbonates, fluorides, and chlorides, together with the oxidizing agent. Generally, it is known that, when the molten salt is composed of a mixture salt, it tends to a lowering in melting point. Accordingly, when it is desired to carry out the film removal at a relatively low temperature, it is preferred that a molten salt composed of a mixture salt be used. Examples of nitrites include lithium nitrite, sodium nitrite, potassium nitrite, magnesium nitrite, calcium nitrite, and barium nitrite. Examples of carbonates include lithium carbonate, sodium carbonate, potassium carbonate, magnesium carbonate, calcium carbonate, and barium carbonate. Examples of fluorides include lithium fluoride, sodium fluoride, potassium fluoride, magnesium fluoride, calcium fluoride, and barium fluoride. Examples of chlorides include lithium chloride, sodium chloride, potassium chloride, magnesium chloride, calcium chloride, and barium chloride.

It is preferred that the temperature of the molten salt during the film removal be 100° C. or more, or not less than 120° C., but not more than 700° C. It is possible to obtain a practical film removal speed when the temperature of the molten salt is 100° C. or more, or not less than 120° C., because a stronger oxidizing function and a higher film removal speed are obtained at a higher temperature of the molten salt. On the other hand, when the temperature of the molten salt exceeds 700° C., a deformation of the substrate or a change of the properties of the substrate may undesirably occur due to an influence of heat.

An example of the index of a molten salt appropriately usable in the film removal method of the present invention is a removal rate (removal progress distance per hour) of an amorphous carbon. A molten salt, which exhibits a removal rate of 0.01 μm/hour or more, or not less than 0.1 μm/h, but not more than 10 μm/h for an amorphous carbon consisting of 75 at % of carbon and 25 at % of hydrogen (75 at % C-25 at % H) at a molten salt temperature of 450° C., is suitable for the film removal method of the present invention. Carbons, which are a main component of the amorphous carbon, includes carbons ($Csp^2$) having an $Sp^2$ hybrid orbital and carbons ($Csp^3$) having an $sp^3$ hybrid orbital, due to a difference of atom orbitals in chemical bonding. The ratio between $Csp^2$ and $Csp^3$ in the overall carbon in the amorphous carbon may be varied, depending on, for example, the production method, even when the composition of the amorphous carbon is constant. For this reason, even when the film removal method of the present invention is carried out for carbon-based coating films having the same composition and the same structure, under the same condition, there may be a removal rate difference if the $Csp^2$-to-$Csp^3$ ratios of the carbon-based coating films are different. In an amorphous carbon, which has a composition of 75 at % C-25 at % H, however, the variation in the ratio between $Csp^2$ and $Csp^3$ caused by the film formation method is not high. Accordingly, for the index of the molten salt appropriately usable in the film removal method of the present invention, the removal rate of the amorphous carbon, which has a composition of 75 at % C-25at % H, is used. A practical film removal rate can be obtained when the removal rate is 0.01 μm/h or more at a molten salt temperature of 450° C.

A Molten salt, which is usable at a temperature lower than the heat-resistant temperature of the substrate, may be used, as long as the molten salt does not come into contact with the substrate. However, it is preferred that a molten salt exhibiting a high corrosion resistance for the substrate be used, in cope with the case in which the molten salt comes into contact with the surface of the substrate in accordance with a complete removal of the coating film, or the case in which there is a possibility that pitting occurs in the coating film due to defects. For example, it is preferred that a molten salt, which exhibits a substrate corrosion rate lower than the film removal rate thereof for the carbon-based coating film of the coated member, in detail, a substrate corrosion rate (corrosion progress distance per hour) of 1 μm/h or less or 0.1 μm/h or less.

The film removal method of the present invention can remove at least a portion of the carbon-based coating film coated over the surface of the substrate. That is, in accordance with the film removal method of the present invention, it is possible to remove the overall portion of the carbon-based coating film, or to remove only the surface portion of the carbon-based coating film. It is possible to re-use the substrate by completely removing the carbon-based coating film, and then coating a new carbon-based coating film over the surface of the substrate. It is also possible to clean fixtures or elements constituting a film forming apparatus for the carbon-based coating film. When only the surface portion of the carbon-based coating film is removed, it is possible to adjust the thickness of the coating film of the coated member. It is also possible to finely adjust the film thickness by adjusting the kind of the molten salt or the temperature of the molten salt, and thus optimizing the film removal rate. Since the film removal method of the present invention is chemical polishing using a molten salt, it is possible to uniformly remove the coating film without causing a high surface roughness of the film surface. Accordingly, the coated member can be used as it is, without any additional surface treatment after the film thickness adjustment.

The film removal method of the present invention can be used in a method for regenerating the coated member. That is, the coated member regeneration method of the present invention includes removing the carbon-based film from the coated member, using the film removal method of the present invention, and then forming a coating film on at least a portion of the surface, from which the carbon-based film has been removed. There is no particular limitation on the kind of the coating film newly formed. It is possible to regenerate the member as a coated member usable for a new purpose by forming a TiN film or a Cr-plated film, in place of a carbon-based film such as a DLC film. Of course, a carbon-based coating film having the same composition as the removed carbon-based coating film may be formed.

As described above, in accordance with the film removal method of the present invention, it is possible to suppress the corrosion of the substrate caused by the molten salt, by selecting an appropriate combination of the kind of the molten salt used and the material of the substrate. It is also possible to remove the coating film at a relatively low temperature range, and thus to suppress the substrate from being degraded or deformed, by appropriately selecting the kinds of the oxidizing agent, etc. included in the molten salt. That is, the substrate, which is obtained after the removal of the coating film from the coated member using the film removal method of the present invention, has the same shape and properties as the substrate of the coated member before the film removal. As a result, there is little quality difference between the coated member before the regeneration and the coated member after the regeneration.

The coated member regeneration method of the present invention is effective for a tool or mold having a carbon-based coating film at the surface thereof, when the carbon-based coating film is in a damaged state. It is difficult to form a new coating film only on a region where the coating film is in a damaged state. Accordingly, it is possible to re-use the tool or mold by completely removing the carbon-based coating film, and then coating a new film over the surface of the tool or mold.

The coating film removal method and coated member regeneration method according to the present invention are not limited to the following example. The coating film removal method and coated member regeneration method according to the present invention can be implemented in various embodiments, for which changes and improvements implementable by those skilled in the art are made, without departing from the spirit or scope of the inventions.

EXAMPLE

In this embodiment, a coating film was removed from a coated member having a DLC film or a DLC film containing silicon (DLC-Si film) formed over the surface of a steel substrate as the coating film.

[Manufacture of Coated Member]
[Manufacture of Coated Member Having DLC Film]

Figure 2:
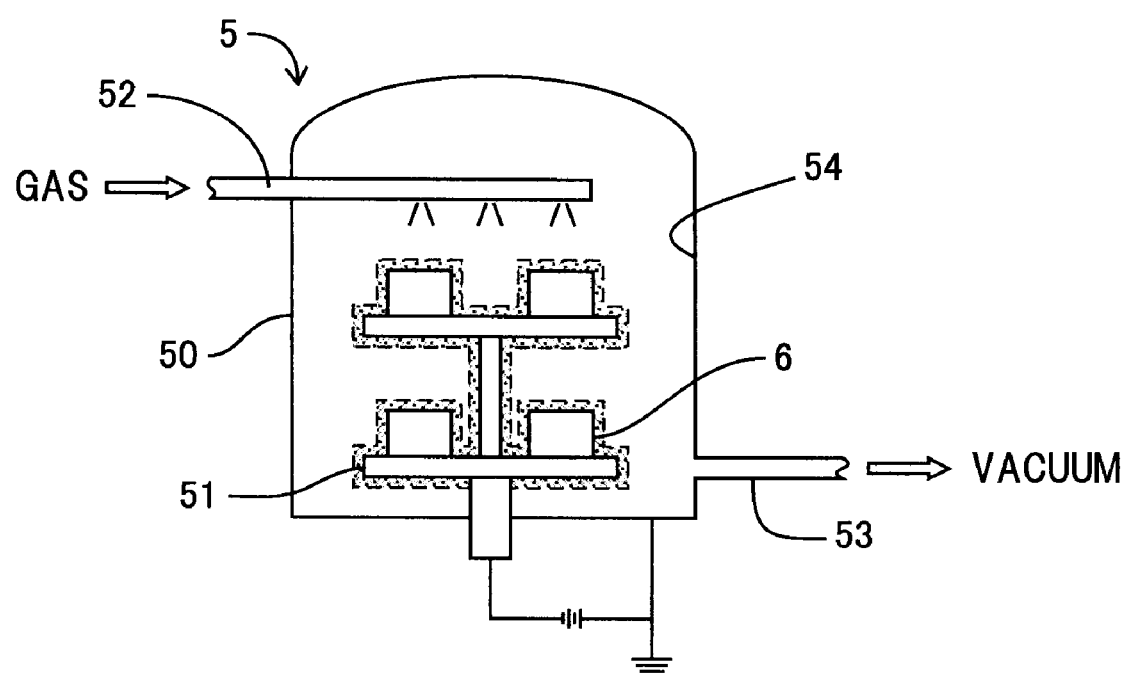
FIG. 2 is a schematic view of a direct-current (DC) plasma CVD apparatus.

A DLC film was formed over the surface of a cylindrical steel substrate (alloy tool steel (SKD11 as per JIS), Φ15 mm×25 mm, and surface roughness (JIS) Rz0.3 μm), using a DC plasma CVD apparatus shown in FIG. 2. As shown in FIG. 2, the DC plasma CVD apparatus 5 includes a chamber 50 made of stainless steel, a base 51, a gas inlet pipe 52, and a gas outlet pipe 53. The gas inlet pipe 52 is connected with various gas bombs (not shown) via valves (not shown). The gas outlet pipe 53 is connected with a rotary pump (not shown) and a diffusion pump (not shown) via valves (not shown).

Substrates 6 were arranged on the base 51 disposed in the chamber 50. Thereafter, the chamber 50 was sealed, and gases within the chamber 50 were evacuated using the rotary pump and diffusion pump connected with the gas outlet pipe 53. 14 sccm (i.e., standard cc/min) of hydrogen gas was introduced from the gas inlet pipe 52 into the chamber 50, to obtain the gaseous pressure of about 133 Pa. Subsequently, a DC voltage of 200V was applied between the base 51 and a positive electrode plate 54 made of stainless steel which was installed in the chamber 50, to generate electrical discharge. A temperature increase caused by an ion bombardment was carried out until the surface temperature of each substrate 6 reaches 500° C. After the temperature increase, an activation treatment, such as cleaning of the surface of each substrate 6, was carried out in accordance with an ion bombardment using a mixture gas of hydrogen gas and argon gas.

Following the activation treatment, a DLC film was formed over the surface of each substrate 6. That is, a DLC film having a thickness of 6 μm was formed by supplying benzene, as a raw material gas, from the gas inlet pipe 52 such that 20 sccm of benzene, 30 sccm of hydrogen gas, and 30 sccm of argon gas are introduced, and carrying out a film formation process at a pressure of about 400 Pa, a voltage of 300V (current of 1 to 2 A), and a temperature of 500° C. for 60 minutes.

The obtained DLC film had a composition of 75 at % C-25 at % H. The H content of the film was measured using an elastic recoil detection analysis (ERDA).

[Manufacture of Coated Member Having DLC-Si Film]

Following the activation treatment carried out in the above-described procedure, a DLC-Si film was formed over the surface of each substrate 6. That is, a DLC-Si film having a thickness of 6 μm was formed by supplying methane and TMS, as raw material gases, from the gas inlet pipe 52 such that 50 sccm of methane, 10 sccm of TMS, 30 sccm of hydrogen gas, and 30 sccm of argon gas are introduced, and carrying out a film formation process at a pressure of about 400 Pa, a voltage of 300V (current of 1 to 2 A), and a temperature of 500° C. for 80 minutes.

The obtained DLC-Si film had a composition of 62 at % C-10 at % Si-28 at % H. The H content of the film was measured using an elastic recoil detection analysis (ERDA). The C content and Si content were measured using an electron probe microanalysis (EPMA).

[Removal of Coating Film]

The coating film was removed from each coated member, to prepare measurement samples to be used in various measurements, which will be described later. The film removal procedure will be described with reference to FIG. 1.

First, a salt and/or a metal oxide weighed to have a certain mole ratio was charged in an amount of 150 g into a melting bath made of stainless steel (SUS vessel 91) and internally provided with a thermocouple not shown. Thereafter, the SUS vessel 91 was disposed in an electric furnace 92, and was then heated in the air atmosphere, to obtain a liquid-phase melting salt 2. After the melting salt 2 reached a certain temperature, the coated member 10 was put into the melting salt 2, and was then maintained in a state of being immersed in the melting salt 2 for a certain time (0.5 to 20 hours), to remove at least a portion of the coating film (① film removing process). During this process, the output power of the electric furnace 92 was controlled to maintain the melting salt 2 at a constant temperature.

Thereafter, the film-removed coated member 11 was taken out of the molten salt 2, and was then put into a vessel filled with water 3, to be cooled by the water (② cooling process). As the coated member 11 was cooled, the film removal procedure was stopped. Subsequently, the coated member 11 was taken out of the water 3. Thereafter, the coated member 11 was put into a vessel filled with hot water 4 of 98° C., and was maintained for 30 minutes, to be cleaned by the hot water (③ cleaning process). In accordance with the hot water cleaning, the salt attached to the surface of the coated member 11 was dissolved. The cleaned coated member 11 was taken out of the hot water 4, and was then dried, to obtain a measurement sample (④ drying process).

For 18 coated members having a DLC Film or a DLC-Si film as a coating film, a film removal was carried out in accordance with the above-described procedure while changing the kind of the molten salt or the temperature of the molten salt. As a result, measurement samples 1 to 18 were obtained. Table 1 shows the kind of the substrate and the coating film removed, the kind of the molten salt used in the film removal, the mixture ratio of the molten salt, and the temperature of the molten salt, for each of the measurement samples 1 to 18.

TABLE 1

| Measurement Sample No. | Coated Member | | Molten Salt (Mixture Salt) | | Measurement Results Film Removal Rate [μm/h] |
|---|---|---|---|---|---|
| | Substrate | Coating Film | Mixture Ratio (unit: mol %) | Temperature [° C.] | |
| 1 | SKD11 | DLC-Si | NaNO$_2$<50%>—KNO$_3$<50%> | 145 | 0.011 |
| 2 | SKD11 | DLC-Si | | 160 | 0.011 |
| 3 | SKD11 | DLC-Si | | 200 | 0.017 |
| 4 | SKD11 | DLC-Si | | 300 | 0.12 |
| 5 | SKD11 | DLC-Si | | 400 | 0.42 |
| 6 | SKD11 | DLC-Si | | 450 | 1.2 |

TABLE 1-continued

| Measurement Sample No. | Coated Member | | Molten Salt (Mixture Salt) | | Measurement Results Film Removal Rate |
| --- | --- | --- | --- | --- | --- |
| | Substrate | Coating Film | Mixture Ratio (unit: mol %) | Temperature [° C.] | [μm/h] |
| 7 | SKD11 | DLC-Si | | 500 | 4.4 |
| 8 | SKD11 | DLC-Si | | 550 | 12 |
| 9 | SKD11 | DLC | $NaNO_2$<50%>—$Ca(NO_3)_2$<50%> | 450 | 0.7 |
| 10 | SKD11 | DLC | $KNO_2$<40%>—$Ca(NO_3)_2$<40%>—$NaNO_3$<20%> | 450 | 1.0 |
| 11 | SKD11 | DLC-Si | | 450 | 0.8 |
| 12 | SKD11 | DLC-Si | $KNO_2$<20%>—$KNO_3$<80%> | 450 | 1.1 |
| 13 | SKD11 | DLC | $KCl$<40%>—$CaCl_2$<40%>—$NaNO_3$<20%> | 450 | 0.2 |
| 14 | SKD11 | DLC-Si | | 450 | 0.15 |
| 15 | SKD11 | DLC | $KCl$<35%>—$CaCl_2$<35%>—$NaNO_3$<20%>—$Li_2SO_4$<10%> | 450 | 0.11 |
| 16 | SKD11 | DLC-Si | | 450 | 0.13 |
| 17 | SKD11 | DLC-Si | $K_2CO_3$<25%>—$Li_2CO_3$<49%>—$Na_2CO_3$<25%>—$MoO_3$<1%> | 450 | 0.8 |
| 18 | SKD11 | DLC-Si | $K_2CO_3$<25%>—$Li_2CO_3$<50%>—$Na_2CO_3$<25%> | 450 | 0.011 |

[Measurement]

A. Evaluation of Corrosion Resistance of Molten Salt for Substrate

In order to check the corrosion resistance of the molten salt for the substrate, substrates (having no coating film) were immersed in respective molten salts described in Table 1, and a variation in the weight of each substrate occurred between before and after the immersion was measured. There was no substrate weight reduction exhibited after the immersion, for any molten salts. Thus, there was no remarkable substrate corrosion caused by the molten salts.

B. Measurement of Film Thickness and Calculation of Film Removal Rate

For each of the measurement samples 1 to 18, the thickness of the coating film remaining on the surface of the substrate was measured, and the film removal rate was calculated, based on a film thickness variation occurred between before and after the immersion and the immersion time. For the film thickness measurement, a Calo tester was used. The results are described in Table 1.

The measurement samples 1 to 8 are samples, from which the DLC-Si film were removed using the same kind of molten salts. From the measurement results, it could be seen that the higher the molten salt temperature, the higher the film removal rate. When $KNO_3$ functioning as an oxidizing agent was used alone without use of $NaNO_2$ functioning as a reducing agent for carbon, the molten salt of $KNO_3$ could be used only in a temperature range of 350 to 500° C. However, when $KNO_3$ was used together with $NaNO_2$ in the form of a mixture salt, it could be used even at a low temperature of 300° C. or less.

There was little coating film remaining on the surface of the measurement sample 8. The DLC-Si film was substantially removed in accordance with the immersion for 30 minutes. That is, it could be seen that, in accordance with the film removal method of the present invention, a film removal is achieved even for a DLC-Si film containing silicon, without being restrained by the silicon.

From the results obtained for the measurement sample 6 and 9 to 18, it could be seen that the film removal rate is adjustable at the same molten salt temperature in accordance with a change of the kind of the molten salt used.

For the measurement sample 18, a film removal was achieved using a molten salt prepared through a combination of various carbonates. Since carbonates exhibit a weak oxidizing function for carbon, the film removal thickness obtained after the immersion for 20 hours was 0.1 μm or less. In this connection, an increase in film removal rate was achieved when a metal oxide ($MoO_3$) having a high oxidizing function for carbon was added to a molten salt constituted by a carbonate, as in the molten salt used for the measurement sample 17.

C. Observation of Surface of Measurement Sample

The surfaces of the measurement samples 1 to 18 were observed with the naked eye. All samples were glossy and smooth. That is, in accordance with the present invention, it was possible to achieve a film removal without causing a high surface roughness of the surface of the remaining coating film.

While the invention has been shown and described with respect to the preferred embodiments, it will be understood by those skilled in the art that various changes and modification may be made without departing from the spirit and scope of the invention as defined in the following claims.

What is claimed is:

1. A coating film removal method for removing an amorphous carbon coating film from a coated member including a substrate, and the amorphous carbon coating film coated on at least a portion of a surface of the substrate, the coating film containing carbon as a main component, comprising: bringing a molten salt having an oxidizing function for carbon into contact with the amorphous carbon coating film containing carbon as the majority component, to remove at least a portion of the amorphous carbon coating film coated over the surface of the substrate.

2. The coating film removal method according to claim 1, wherein the molten salt comprises at least one oxidizing agent selected from the group consisting of nitrates, sulfates, and metal oxides.

3. The coating film removal method according to claim 2, wherein the molten salt comprises a mixture salt comprising at least one selected from the group consisting of nitrites, carbonates, fluorides, and chlorides, together with the oxidizing agent.

4. The coating film removal method according to claim 1, wherein the molten salt has a temperature of 100° C. or more.

5. The coating film removal method according to claim 1, wherein the molten salt has a temperature of not less than 120° C., but not more than 700° C.

6. The coating film removal method according to claim 1, wherein the molten salt exhibits a removal rate of 0.01 μm/h or more for amorphous carbon consisting of 75 at % of carbon and 25 at % of hydrogen, when the molten salt has a temperature of 450° C.

7. The coating film removal method according to claim 1, wherein the amorphous carbon coating film contains at least one selected from the group consisting of hydrogen, nitrogen, fluorine, oxygen, a metal element, and a semiconductor element.

8. The coating film removal method according to claim 1, wherein the amorphous carbon coating film contains at least one selected from the group consisting of hydrogen, nitrogen, fluorine and oxygen.

9. The coating film removal method according to claim 8, wherein the amorphous carbon film further contains at least one selected from the group consisting of a metal element and a semiconductor element.

10. The coating film removal method according to claim 7, wherein the at least one element selected from the group consisting of the metal element and the semiconductor element has a content of 40 at % or less in the carbon-based coating film.

11. The coating film removal method according to claim 7, wherein the metal element comprises at least one of titanium, chromium, and tungsten, and the semiconductor element comprises silicon.

12. The coating film removal method according to claim 1, wherein the substrate comprises a metal substrate, a ceramic substrate, or a substrate made of a semiconductor material.

13. A coated member regeneration method for regenerating a coated member having a an amorphous carbon coating film, comprising: removing the amorphous carbon coating film from the coated member, using the coating film removal method as set forth in claim 1; and forming a subsequent coating film on at least a portion of a surface of the film-removed member.

* * * * *